US010714428B2

(12) United States Patent
Reynes et al.

(10) Patent No.: US 10,714,428 B2
(45) Date of Patent: Jul. 14, 2020

(54) SEMICONDUCTOR POWER DEVICE AND A METHOD OF ASSEMBLING A SEMICONDUCTOR POWER DEVICE

(71) Applicant: agile POWER SWITCH 3D—INTEGRATION aPSI3D, Tarbes (FR)

(72) Inventors: Jean-Michel Francis Reynes, Pompertuzat (FR); Jacques Pierre Henri Favre, La Baule (FR); Renaud André Lacabanne, Tarbes (FR)

(73) Assignee: AGILE POWER SWITCH 3D—INTEGRATION APSI3D, Tarbes (FR)

( * ) Notice: Subject to any disclaimer, the term of this patent is extended or adjusted under 35 U.S.C. 154(b) by 0 days.

(21) Appl. No.: 15/572,402

(22) PCT Filed: May 8, 2015

(86) PCT No.: PCT/EP2015/060165
§ 371 (c)(1),
(2) Date: Nov. 7, 2017

(87) PCT Pub. No.: WO2016/180434
PCT Pub. Date: Nov. 17, 2016

(65) Prior Publication Data

US 2018/0286814 A1 Oct. 4, 2018

(51) Int. Cl.
*H01L 21/68* (2006.01)
*H01L 21/66* (2006.01)
(Continued)

(52) U.S. Cl.
CPC .......... *H01L 23/544* (2013.01); *H01L 21/681* (2013.01); *H01L 22/20* (2013.01);
(Continued)

(58) Field of Classification Search
CPC ............. H01L 21/681; H01L 23/49816; H01L 25/074; H01L 25/50; H01L 22/20;
(Continued)

(56) References Cited

U.S. PATENT DOCUMENTS 4,565,314 A 1/1986 Scholz
7,859,079 B2 12/2010 Kondou et al.
(Continued)

FOREIGN PATENT DOCUMENTS

EP 0854520 A2 7/1998
JP 61125072 U 8/1986
(Continued)

OTHER PUBLICATIONS

Machine translation of JP2011/249636 (Year: 2019).*
(Continued)

*Primary Examiner* — Bilkis Jahan
*Assistant Examiner* — Victor V Barzykin
(74) *Attorney, Agent, or Firm* — Kenealy Vaidya LLP

(57) ABSTRACT

Some embodiments are directed to a semiconductor power device and a method of assembling such a device is provided. The semiconductor power device includes a first substrate, a second substrate and an interconnect structure. The first substrate includes a switching semiconductor element, a first electrically conductive layer(s) and a first receiving element. The second substrate includes a second receiving element and a second electrically conductive layer (s). The interconnect structure provides an electrical connection between the first electrically conductive layer and the second electrically conductive layer. The interconnect structure further includes a plurality of interconnect elements of an electrical conductive material. At least one of the plurality of interconnect elements is an alignment interconnect element. The alignment interconnect element is
(Continued)

partially received by the first receiving element and is partially received by the second receiving element for aligning a relative position of the first substrate with respect to the second substrate.

8 Claims, 5 Drawing Sheets

(51) Int. Cl.

| | |
|---|---|
| ***H01L 25/00*** | (2006.01) |
| ***H01L 23/544*** | (2006.01) |
| ***H01L 23/498*** | (2006.01) |
| ***H01L 25/07*** | (2006.01) |
| *H01L 23/367* | (2006.01) |

(52) U.S. Cl.
CPC .. *H01L 23/49811* (2013.01); *H01L 23/49816* (2013.01); *H01L 23/49833* (2013.01); *H01L 23/49838* (2013.01); *H01L 25/074* (2013.01); *H01L 25/50* (2013.01); *H01L 23/3675* (2013.01); *H01L 2223/5442* (2013.01); *H01L 2223/54426* (2013.01); *H01L 2223/54486* (2013.01)

(58) Field of Classification Search
CPC ............. H01L 23/49838; H01L 23/544; H01L 2224/81136; H01L 2224/81141; H01L 24/81; H01L 2924/13055; H01L 2224/73253; H01L 2224/16225; H01L 2924/13091; H01L 2924/00
See application file for complete search history.

(56) References Cited

U.S. PATENT DOCUMENTS

2003/0146518 A1* 8/2003 Hikita ................ H01L 23/3128 257/777
2005/0213896 A1 9/2005 Marion et al.
2008/0315433 A1* 12/2008 Chen ................ H01L 21/76898 257/777
2015/0228571 A1* 8/2015 Shiraki ............ H01L 23/49838 257/701

FOREIGN PATENT DOCUMENTS

| | | | |
|---|---|---|---|
| JP | 62178564 | U | 11/1987 |
| JP | 2002-368373 | A | 12/2002 |
| JP | 2005-197435 | A | 7/2005 |
| JP | 2008-021751 | A | 1/2008 |
| JP | 2011-249636 | A | 12/2011 |

OTHER PUBLICATIONS

Machine translation of JP2002/368373 (Year: 2019).*
International Search Report and Written Opinion for PCT Patent App. No. PCT/EP2015/060165 (dated Feb. 5, 2016).

* cited by examiner

SEMICONDUCTOR POWER DEVICE AND A METHOD OF ASSEMBLING A SEMICONDUCTOR POWER DEVICE

CROSS REFERENCE TO RELATED APPLICATION(S)

This application is a national phase filing under 35 C.F.R. § 371 of and claims priority to PCT Patent Application No. PCT/EP2015/060165, filed on May 8, 2015, the content of which is hereby incorporated in its entirety by reference.

BACKGROUND

Some embodiments relate to semiconductor power devices. A power device is capable of switching relatively high currents and/or at relatively high voltages. Such currents may be in the order of one to hundreds of Amperes and such voltages may be in the order of a few hundreds to thousands of Volts. Some embodiments further relate to assembling a semiconductor power device.

U.S. Pat. No. 7,859,079B2, which is incorporated by reference, discloses a switching power semiconductor device that includes at least two substrates. The substrates are arranged substantially parallel to each other. The surfaces of the substrates and the surfaces of semiconductor elements arranged on the substrates may include electrodes. A subset of the electrodes face each other and electrical connections are provided between them. In an embodiment, the electrical connections are provided by copper balls that are interposed between two electrodes and that are soldered to the electrodes. In another embodiment, drop-shaped elements of solder or lead are provided between two electrodes. In yet another embodiment, drop-shaped elements of solder or lead are provided on electrodes of one of the substrates, and copper balls are interposed between the drop-shaped elements and electrode of the other one of the substrates. The copper balls and/or the drop-shaped elements have a size that is adapted to a required distance between the electrodes between which they are interposed such that the two substrates are arranged substantially parallel to each other. The copper-balls and/or the drop-shaped elements provide an electrical connection between different electrical elements of the two substrates. In addition, heat can be transported away from the semiconductor elements provided on the substrates via the copper-balls and/or the drop-shaped elements.

The copper balls and/or the drop-shaped elements of the above discussed patent application provide a spacing between the two substrates and, thereby, define a distance between the two substrates. In the following of this document, it is assumed that a line that forms the shortest distance between the two substrates is a z-dimension. Thus, in other words, the copper balls and/or the drop-shaped elements define, in the z-dimension, a relative position of the two substrates with respect to each other. In the following of this document it is further assumed that the x-dimension and the y-dimension are oriented perpendicular to the above discussed z-dimension. Hence, a 3-dimensional Cartesian coordinate system is assumed. When, in the above cited patent publication, the first substrate and the second substrate are exactly flat and the copper balls have a size such that the two substrates are arranged exactly parallel to each other, the x-dimension and the y-dimension define a virtual plane that is also parallel to the two substrates.

SUMMARY

During the assembling of a switching power semiconductor device, such as the switching power semiconductor device of the above cited patent, the two substrates must or should also be well aligned with respect to each other in the x-dimension and the y-dimension. A solution to align the two substrates in the x-dimension and the y-dimension during the assembly makes use of visible alignment markers that are recorded by cameras and actuators; and are controlled on basis of output of a video processing systems to move the two substrates in the correct (x,y)-position with respect to each other. Unfortunately, it has been seen that such a solution for aligning the first substrate with respect to the second substrate in the x-dimension and the y-dimension is not accurate enough. Typically, just before the copper balls or the drop-shaped elements are fastened to the first substrate or the second substrate (e.g., by soldering), the first substrate and/or the second substrate may move in the x-dimension or the y-dimension and then the substrates are not aligned accurately enough with respect to each other.

An aspect of some embodiments is to provide a switching power semiconductor device including two substrates that are better aligned with respect to each other.

A first aspect of some embodiments provide a semiconductor power device. A second aspect of some embodiments provides a method of assembling a semiconductor power device. Advantageous embodiments are defined in the dependent claims.

A semiconductor power device in accordance with the first aspect of some embodiments includes a first substrate, a second substrate and an interconnect structure. The first substrate includes a switching semiconductor element. The first substrate has a first surface and locally includes first electrically conductive layers and a first receiving element. The switching semiconductor element is provided on the first surface. The second substrate includes a second surface facing the first surface. The second substrate includes a second receiving element and locally including second electrically conductive layers. The interconnect structure is for providing at least one electrical connection between at least one of the first electrically conductive layers at one side and at least one of the second electrically conductive layers at the other side. The interconnect structure includes a plurality of interconnect elements of an electrical conductive material. At least one of the plurality of interconnect elements is an alignment interconnect element. The alignment interconnect element is partially received by the first receiving element and is partially received by the second receiving element for aligning a relative position of the first substrate with respect to the second substrate. The receiving elements having a recess shaped for at least partially receiving the alignment interconnect element and the shape of the alignment interconnect element is selected to affect the positioning of the alignment interconnect element to a unique fixed relative position with respect to the receiving element, when the receiving elements and the alignment interconnect element are applied to each other and when one of the alignment interconnect element or the receiving element receives a force. Thereby, the first substrate is aligned with respect to the second substrate.

In the power semiconductor device according to the above discussed embodiment, the alignment of the first substrate with respect to the second substrate is provided as follows. At an appropriate position on the first substrate and at an appropriate corresponding position on the second substrate; receiving elements are provided that are configured to receive the alignment interconnect element. The appropriate positions are chosen, and the specific size and shape of the alignment interconnect element is selected such that, when the first receiving element receives a portion of the alignment interconnect element, and the second receiving element also receives a portion of the alignment interconnect element, the relative position of the first substrate with respect to the second substrate is the (may be required) aligned position. Because the receiving elements receive portions of the alignment interconnect element, the position of the alignment interconnect element is fixed to the positions of the receiving elements and, consequently, the relative position of the first substrate with respect to the second substrate is fixed. Furthermore, because the shapes of the recesses of the receiving elements and the shape of the alignment interconnect element are both selected such that they cooperate towards a unique fixed position of the alignment interconnect element with respect to the receiving elements when they are applied to each other under the influence of a force, there is only one specific relative arrangement possible of the alignment interconnect element with respect to the receiving elements. Thereby, the receiving elements are forced towards a relative position with respect to each other that is well-defined and fixed, and thereby, the substrates are forced towards a relative position with respect to each other that is well-defined and fixed. In most embodiments, the force that is applied to either the receiving element or the alignment interconnect element, may be the gravitational force but it may also be a force that is actively applied to one of the elements. It is further to be noted that aligning the substrates towards a unique fixed relative position with respect to each other also results in aligning the pattern of the first electrically conductive layers with respect to the pattern of the second electrically conductive layers. Thus, one may also read in this application that the receiving elements and the alignment interconnect element have the function of aligning the patterns of the electrically conductive layers with respect to each other.

In line with the discussion of the related art, a Cartesian coordinate system can be defined in the semiconductor power device. In the semiconductor power device according to some embodiments, the shape and size of the receiving elements and of the alignment interconnect element define the distance between the two substrates and, consequently, define the relative position of the first substrate with respect to the second substrate in the z-dimension. The position of the first receiving element on the first substrate and the position of the second receiving element on the second substrate define the relative alignments of the two substrates in the x-dimension and the y-dimension.

According to an embodiment, a portion of the alignment interconnect element is automatically received by the receiving element when both elements are placed on top of each other and a force is received by one of the elements and the other element is at a fixed position. For example, when an alignment interconnect element is placed on a receiving element that has a fixed position, a gravitational force is received by the alignment interconnect element and the force results in the partial reception of the alignment interconnect element by the respective receiving element and the gravitational force forces the alignment interconnect element towards the unique fixed location. In an example, the alignment interconnect element has a spherical shape and the receiving elements are holes: the spherical shape is automatically at least partially received by the hole when the spherical shape is placed on top of the hole and the sphere rolls towards one unique position such that it is optimally partially received by the receiving element. This has the advantage that, during the assembling of the power semiconductor device, the alignment is performed automatically and no separate steps may be required to force the receiving elements to receive the portion of the alignment interconnect element.

The switching semiconductor element may be a transistor, a Field Effect Transistor (FET), a MOS Field Effect Transistor (MOSFET), thyristor, an insulated-gate bipolar transistor (IGBT), diode or another appropriate semiconductor switching element. The first substrate and/or the second substrate may also include other electronic elements including other elements made of semiconductor material, such as silicon, silicon carbide, gallium arsenide, gallium nitride, diamond based semiconductor material or other appropriate semiconductor materials. Examples are resistors, capacitors, inductors, integrated circuits or other appropriate electronic elements.

The substrates may be manufactured of multiple layers of thermally conductive and electrically insulating materials (e.g., ceramics) and highly electrically conductive materials (e.g., metals) for routing. Examples of ceramics are Aluminum Nitride (AN), Aluminum Oxide ($Al_2O_3$) and Silicon Nitride ($Si_3N_4$). Another example of a substrate is $Si_3N_4$ sandwiched between two thin metal layers, for example, thin layers of copper or aluminum. Typically, in the relevant field, such substrates are termed Direct Bonded Copper (DBC) substrates or Active Metal Bonding/Brazing (AMB) substrates. The electrically conductive layers and/or the interconnect elements may be made of metal such as copper or aluminum, but also of other metals or other electrically conductive materials. Optionally, the material(s) of which the electrically conductive layers and/or the interconnect elements are made, is a good heat conductor such that the layers and the interconnect elements contribute to the distribution and conduction of heat towards places where heat can be conducted away from the semiconductor power device (for example, an interface to a heat sink). In the following of this document, one may read "electrode" instead of electrically conductive layer, however, it is to be noticed that the electrically conductive layers are not by definition coupled to a specific voltage or signal the electrically conductive layers may also be isolated islands of such material(s).

Optionally, the first substrate includes a plurality of first receiving elements, the second substrate includes a plurality of second receiving elements and the interconnect elements includes a plurality of alignment interconnect elements, each respective one of the plurality of alignment interconnect elements is partially received by a respective one of the first receiving elements and is partially received by a corresponding one of the second receiving elements for aligning a relative position of the first substrate with respect to the second substrate. In other words, there is a plurality of 3-turples, each of which includes a first receiving element, a second receiving element and an alignment interconnect element. The position of the first receiving element of a 3-turple on the first substrate matches with a location on the second substrate to obtain the effect that, when the alignment interconnect element of the specific 3-turple is at least partially received by the receiving elements of the 3-turple, the combination of receiving elements and the alignment interconnect element provides a required alignment in the x-y-dimensions. The previously discussed semiconductor power device includes at least one such 3-turple, while this optional embodiment includes a plurality of such 3-turples. By providing a plurality of such 3-turples, the alignment mechanism is more accurate and is more reliable.

Optionally, the first substrate includes at least three first receiving elements, at least three second receiving elements and at least three alignments interconnect elements. In other words, in the previous discussed optional embodiment, there are at least two 3-turples of receiving elements and an alignment interconnect element, while this optional embodiment provides at least three of such 3-turples. This results, at least in the z-dimension, in a stable positioning of the first substrate with respect to the second substrate. A comparison can be made with a table: when a table has at least three legs, the table can be positioned in a stable position on the ground, while a table with two legs turns over.

Optionally, at least one of the first receiving element and the second receiving element is a hole or a recess in one of the first electrically conductive layers and the second electrically conductive layers, respectively. A hole or a recess can be manufactured relatively easily. Furthermore, when the receiving element is a hole or a recess, no additional components may be required for the receiving element and thereby, costs are saved. Furthermore, when the holes or the recesses are only made in the electrically conductive layers, the holes or recesses do not extend into the first and second substrate which is advantageous in most modern electronic circuitries because several electrical connections are provided inside the substrates—in other words, other electrical connections provided in the substrate are not damaged or do not need to be designed around the holes or recesses. Furthermore, holes or recesses can partially receive a portion of specific alignment interconnect elements relatively easily. For example, when the alignment interconnect element has a spherical shape or is egg shaped, then it will be automatically partially received by a hole in the electrically conductive layers that has an appropriate size to partially receive such an alignment interconnect element.

Optionally, the first receiving element is electrically coupled to one of the first electrically conductive layers. Optionally, the second receiving element is electrically coupled to one of the second electrically conductive layers. Optionally, the alignment interconnect element is electrically coupled to the receiving elements. In addition to providing a good alignment, the alignment interconnect element may have a role of an electrical conductor to provide an electrical connection between the first substrate and the second substrate. To fulfill this role, the interconnect alignment element may be electrically coupled to the receiving elements which may be electrically coupled to the electrically conductive layers of the substrates. When the receiving elements are a separate element provided on the substrates, the receiving elements may also be electrically coupled to the electrically conductive layers to provide an electrical connection between the alignment interconnect element and the electrically conductive layer. The receiving elements and the interconnect elements may be attached (for example, soldered) to the electrically conductive layers and receiving elements, respectively—the receiving elements and the interconnect elements may also be in direct physical contact with the electrically conductive layers and the receiving elements, respectively.

Please note that the receiving element may be holes in the electrically conductive layers and the alignment interconnect element may be spherical shaped aspects. When the spherical shaped aspect is partially provided in the hole, the spherical shaped aspect may touch the edge of the hole thereby, obtaining an electrical conductive coupling. In addition, the spherical shaped aspect being partially received by the hole may be attached (for example, soldered) to the electrically conductive layer.

Optionally, the first receiving element is thermally coupled to one of the first electrically conductive layers. Optionally, the second receiving element is thermally coupled to one of the second electrically conductive layers. Optionally, the interconnect alignment element is thermally coupled to the receiving elements. In addition to providing a good alignment, the alignment interconnect element may have a role as a thermal conductor to conduct heat away from the first substrate to the second substrate or from the second substrate to the first substrate (and optionally, further to an interface, for example, a heat sink).

Optionally, the plurality of interconnect elements includes at least two interconnect elements having depths different from each other and the depths being adapted to a distance between the electrically conductive layers, between which the interconnect elements are arranged, the depths being measured in a direction of a shortest line from the first substrate and to the second substrate at the position of the interconnect elements. In this optional embodiment, at least two interconnect elements have different depths. These two interconnect elements may be the alignment interconnect elements, but may also be two interconnect elements that have no role in the alignment of the first substrate with respect to the second substrate. In an ideal semiconductor power device, the interconnect elements have a very good contact with the electrically conductive layers of the substrate and this may be achieved by adapting the size/depth of the interconnect elements to the distance between the first substrate and the second substrate at the location where the respectively interconnect elements are arranged. Additionally, the interconnect elements may be attached (for example, soldered) to the electrically conductive layers thereby, increasing the cross-cut area of the electrical connection.

Although, in many practical applications, it seems that the first substrate is arranged parallel to second substrate, the distance between the first substrate and the second substrate may vary significantly in the order of many micrometers. For example, the first substrate and/or the second substrate may be subjected to warpage and this may immediately result in a non-optimal electrical connection when the depth of the interconnect elements is not adapted to those distance variations. It may even result in an open circuit instead of a connection. Additionally, the first substrate and/or second substrate are subjected to manufacturing tolerances resulting in, for example, varying thickness of the substrates and/or a non-flat surface. The electrically conductive layers may also have a non-uniform thickness, for example, as the result of different amounts of etching or other manufacturing tolerances. Furthermore, the electrically conductive layers may be attached to the substrate by means of a specific material that, for example, adhere the electrically conductive layers to the substrate and the amount of this specific material may also vary along the surface of the substrate. In addition, some of the electrical elements (such as the switching semiconductor element, but also passive elements like resistors) may have a surface electrode to which an interconnect element provides an electrical connection and those electrical elements have a certain thickness that must or should be taken into account when selecting a specific depth for an interconnect element that is in contact with those electrical elements.

In practical assembly methods of the semiconductor power device, it is first measured or determined how the first substrate will be exactly aligned with respect to the second substrate assuming the alignment interconnect element or alignment interconnect elements are provided at its position/their positions. Subsequently, at every required position of the interconnect elements, it is measured or determined what the distance is between the electrically conductive layers, between which the respective interconnect elements must or should be positioned. Thereafter, different interconnect elements are selected in accordance with the measured or determined distances and these different interconnect elements are arranged at their required positions.

Optionally, a shape of the alignment interconnect element is one of a sphere, a rectangular box, a cube, a rectangular cuboid, a cylinder, a tube, an egg, a rugby-ball, a diamond shaped ball, and a diamond. These shapes provide a good alignment characteristic when being used in combination with a receiving element that has a corresponding shape that is capable of partially receiving the alignment interconnect element. Optionally, the interconnect elements, not being the alignment interconnect element, may also have a shape that is one of a sphere, a rectangular box, a cube, a rectangular cuboid, a cylinder, a tube, an egg, a rugby-ball, a diamond shaped ball, and a diamond. Optionally, the different interconnect elements and/or different alignment interconnect elements, may also have different shapes selected from one of a sphere, a rectangular box, a cube, a rectangular cuboid, a cylinder, a tube, an egg, a rugby-ball, a diamond shaped ball, and a diamond. Optionally, the receiving elements are holes in a respective one of the electrically conductive layers and the alignment interconnect elements are spheres. The radius of the spheres is larger than the radii of the holes. When a hole is made in electrically conductive layers and the hole has a radius that is smaller than the radius of a spherical shaped alignment interconnect element, the hole will automatically partially receive, at a fixed position, the spherical shaped alignment interconnect element when either the spherically shaped alignment interconnect element is laid in/on the hole or the other way around under the influence of the gravitational force. Then the alignment interconnect element can only be moved in the x-direction or the y-direction by applying a significant force in the x-direction or the y-direction and, thus, the position of the alignment interconnect element is relatively well fixed with respect to the position of the receiving element. Consequently, the alignment is almost automatically well self-performed purely based on mechanical/physical effects.

Furthermore, the edge of the hole will touch the spherical shaped alignment interconnect element thereby, providing a good electrical contact between the alignment interconnect element and the electrically conductive layer (assuming the alignment interconnect element is also electrically conductive).

It is to be noted that the interconnect elements, not being an alignment interconnect element, may also have a spherical shape.

When the radii of the holes are relatively small with respect to the foreseen radius of the spherical shaped alignment interconnect elements, a wide range of spherical shaped alignment interconnect elements of different radii may be used in combination with the relatively small holes. For example, the foreseen radii of the holes are about half the foreseen radii of the alignment interconnect elements. This provides freedom to use different spherical shaped alignment interconnect elements while assembling the semiconductor power device. For example, a specific radius for the alignment interconnect element may be selected to obtain a specific distance between the first substrate and the second substrate. The radii of the alignment interconnect elements may also be influenced by possible warpage of the first substrate or the second substrate, or varying thicknesses of electrically conductive layers or other manufacturing tolerances.

The same effects are obtained when the alignment interconnect element is egg, rugby-ball or diamond shaped and has a “radius” (measured in the middle of the first substrate and the second substrate) that is larger than the radii of the holes.

Optionally, the radius of the spheres is relatively large compared to the radii of the holes, in particular when the holes are not very deep. The radii of the holes are small enough to ensure that when the sphere is positioned in the hole, the sphere does not touch the bottom of the whole and is in contact with the edge of the hole. For example, the radius of the spheres is 1.3 to 2.5 times larger than the radii of the holes.

Optionally, the second substrate includes a semiconductor element. The semiconductor element may also be a switching semiconductor element examples of which are discussed previously, but may also be passive semiconductor elements like diodes or even resistors made of a semiconductor material. The first substrate and/or the second substrate may also include other electrical components, like resistors, inductors or capacitors. The semiconductor element may also be an integrated circuit.

Optionally, one or more first electrically conductive layers are arranged on or at the first surface. Optionally, one or more first electrically conductive layers are arranged on or at a surface of the switching semiconductor element that is facing away from the first substrate. Optionally, one or more second electrically conductive layers are arranged on or at the second surface. Optionally, one or more second electrically conductive layers are arranged on or at a surface of the semiconductor element. It is to be noted that some other material may be present in between the electrically conductive layers and the substrates, the switching semiconductor element or the semiconductor element—an example of such another material is a sort of glue, gel, epoxy or brazing. Electrically conductive layers being provided on a surface of the switching semiconductor element or on a surface of another electrical component may also be called “surface electrodes”.

According to another aspect of some embodiments, a method of assembling a power semiconductor device is provided. The method includes: i) obtaining a first substrate including a switching semiconductor element, the first substrate having a first surface and locally including first electrically conductive layers and a first receiving element, the switching semiconductor element being provided on the first surface, ii) obtaining a second substrate including a second surface facing the first surface, the second substrate including a second receiving element and locally including second electrically conductive layers, vi) obtaining an alignment interconnect element, v) providing the alignment interconnect element to one of the first receiving element and the second receiving element to affect a partial reception of the alignment interconnect element by the receiving element, vi) providing the alignment interconnect element to one of the first receiving element and the second receiving element to affect a partial reception of the alignment interconnect element by the receiving element.

The method according to the above aspect of some embodiments provides the same benefits as the power semiconductor device according to the first aspect of some embodiments and has similar embodiments with similar effects as the corresponding embodiments of the system. Hence, the method is an efficient and effective method to manufacture power semiconductor devices in which the first substrate is well aligned with respect to the second substrate. In particular, and as discussed before, the receiving elements and the alignment interconnect element provide an effective mechanical means to ensure that the alignment between the first substrate and second substrate is accurate (assuming that the receiving elements are provided at correct locations). In the stage of fastening the electrical conductive alignment interconnect element to the another one of the first receiving element and the second receiving element, no additional sensors and/or actuators may be required to ensure the correct positioning of the second substrate with respect to the first substrate: the partial reception of the alignment interconnect element by the receiving elements automatically ensures the correct alignment. Even if the pre-alignment is relatively weak, this mechanism ensures that this is self-corrected towards the final correct alignment.

In the method the first substrate and the second substrate are obtained. In an optional embodiment, the obtaining of the first substrate and/or the obtaining of the second substrate includes the manufacturing of the first substrate and/or the second substrate.

Optionally, the method of assembling a power semiconductor device further includes a) obtaining data describing a required positioning of the first substrate with respect to the second substrate, b) measuring characteristics of the first receiving element and of the second receiving element, c) determining characteristics of an alignment interconnect element based on the obtained data and the measured characteristics, and wherein in the stage of obtaining the alignment interconnect element, the alignment interconnect element is obtained on basis of the determined characteristics.

The data that is obtained to describe a required positioning of the first substrate with respect to the second substrate may include a required distance between the first substrate and the second substrate, but may include more information, like, at a specific location the distance between the substrates must or should be a specific value and at another specific location the distance between the substrates must or should be another specific value.

In the stage of measuring characteristics of the first receiving element and of the second receiving element, it is, for example, determined what the shape is of the respective receiving elements. Other characteristics may be the distance that the receiving elements protrude out of the surfaces of the substrates when the receiving elements are some sort of protrusions. Measuring characteristics may also include the determination of the exact location of the receiving elements.

In the stage of determining the characteristics of the alignment interconnect element it is ensured that, when the obtained alignment interconnect element has the determined characteristics and is at least partially received by the first receiving elements and partially received by the second receiving element, the first substrate is positioned with respect to the second substrate as described in the required data—in other words, the first substrate is well aligned with respect to the second substrate. For example, in this stage the shape of the alignment interconnect element is selected and/or a length/depth of the alignment interconnect element is selected. For example, when the available alignment interconnect elements are spheres and the receiving elements are holes, a specific radius is selected for spherically shaped alignment interconnect element. In a specific embodiment, when, for example, the receiving elements are not exactly opposite to each other when the first substrate is positioned with respect to the second substrate as described in the obtained data, it may be that, while determining the characteristics of the alignment interconnect elements a specific shape is selected which still results in a good alignment although the receiving elements are not exactly opposite to each other.

The stages of providing the alignment interconnect element to one of the receiving element means that the alignment interconnect element is brought in contact with the receiving element such that it is partially received by the receiving element. This may be done by simply laying the alignment interconnect element on the receiving element, or laying the receiving element on the alignment interconnect element and using the gravity to move the alignment interconnect element, or the receiving element, to such a position that the alignment interconnect element is partially received by the receiving element. In specific embodiments, it may include providing a force to ensure that the alignment interconnect element is partially received by the receiving element.

The alignment interconnect elements used in the method may be manufactured of an electrically conductive material.

Optionally, at least one of the stages of providing the electrically conductive alignment interconnect element to the receiving elements includes one of i) soldering the electrically conductive alignment interconnect element to the receiving elements and ii) sintering the electrically conductive alignment interconnect element to the receiving elements. By using one of these fastening technologies it is ensured that a good electrical connection and/or a good thermal path is obtained from the receiving element to the alignment interconnect element.

Optionally, when the receiving elements are holes or recesses, the stage of measuring the characteristics of the first receiving element and the second receiving element includes at least one of determining a radius of the receiving elements and determining a depth of the receiving elements, the radius of the first receiving element is measured in a plane substantially parallel to the first surface, the radius of the second receiving element is measured in a plane substantially parallel to the second surface, the depth of the first receiving element is measured in a plane substantially perpendicular to the first surface, the depth of the second receiving element is measured in a plane substantially perpendicular to the second surface. It is to be noted that the holes or recesses may extend only into the electrically conductive layers, or may extend into the substrate, or may extend into the combination of the electrically conductive layers and the substrate.

These and other aspects of some embodiments are apparent from and will be elucidated with reference to the embodiments described hereinafter.

It will be appreciated by those with ordinary skill in the art that two or more of the above-mentioned options, implementations, and/or aspects of some embodiments may be combined in any way deemed useful.

Modifications and variations of the device and/or of the method, which correspond to the described modifications and variations of the device, can be carried out by a person with ordinary skill in the art on the basis of the present description.

Figure 1:
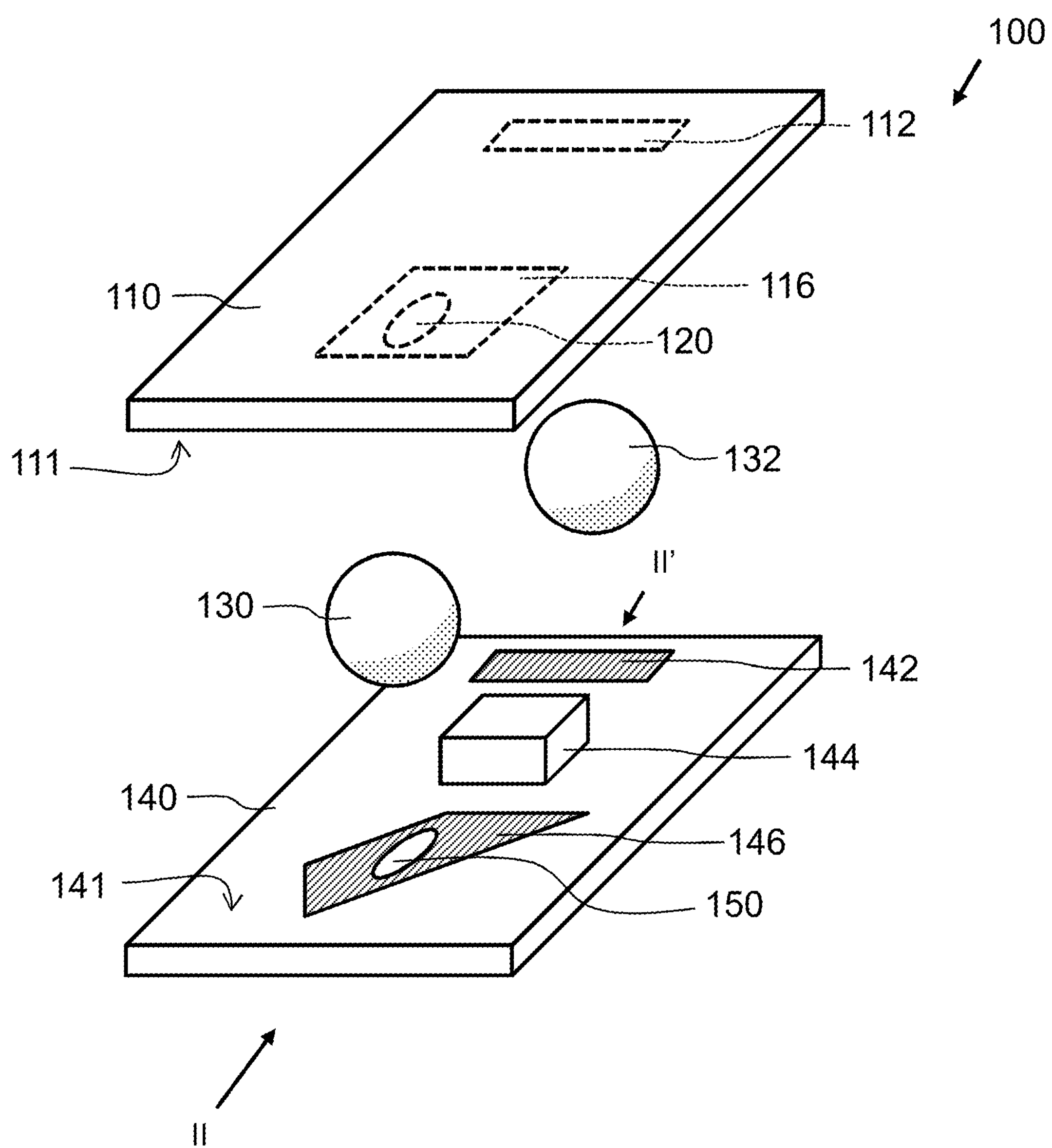
FIG. 1 schematically shows, in an exploded view, an embodiment of a semiconductor power device, FIG. 2*a* schematically shows a cross-sectional view of the embodiment of the semiconductor power device of FIG. 1 along a plane through line II-II' and perpendicular to the first substrate, FIG. 2*b* schematically shows a cross-sectional view of another embodiment of a semiconductor power device, FIG. 3*a* schematically shows a view of an embodiment of a second substrate, FIG. 3*b* schematically shows a view of an embodiment of a first substrate, FIG. 4 schematically shows a view of an embodiment of a semiconductor device, and FIG. 5 schematically shows a method of assembling a power semiconductor device.

Items denoted by the same reference numerals in different figures have the same structural features and the same functions, or are the same signals. Where the function and/or structure of such an item have been explained, there is no necessity for repeated explanation thereof in the detailed description.

The figures are purely diagrammatic and not drawn to scale. Particularly for clarity, some dimensions are exaggerated strongly.

DETAILED DESCRIPTION OF THE EMBODIMENTS

FIG. 1 schematically shows, in an exploded view, an embodiment of a semiconductor power device 100. The semiconductor power device includes a first substrate 140, a second substrate 110 and an interconnect structure. The first substrate 140 has a first surface 141 on which a switching semiconductor element 144 is provided. The first substrate further includes first electrically conductive layers 142, 146. The first substrate 140 further includes a first receiving element 150 which is, in this specific embodiment, a hole 150 in one of the first electrically conductive layers 146. The second substrate 110 has a second surface 111 that faces towards the first surface 141 and includes second electrically conductive layers 112, 116 provided on the second surface. The second substrate 110 further includes a second receiving element 120 which is, in this specific embodiment, a hole in one of the second electrically conductive layers 116. The interconnect structure provides at least one electrical connection between one of the first electrically conductive layers 142, 146 and one of the second electrically conductive layers 112, 116. In the example of FIG. 1 two electrical connections are provided: one between the first electrically conductive layer 142 and the second electrically conductive layer 112, and one between the first electrically conductive layer 146 and the second electrically conductive layer 116. The interconnect structure includes interconnect elements 130, 132, of which one is an alignment interconnect element 130. In the example of FIG. 1, the interconnect element 132 and the alignment interconnect element 130 are spheres made of an electrically conductive material (e.g., copper). The interconnect element 132 is interposed between the first electrically conductive layer 142 and the second electrically conductive layer 112. The alignment interconnect element 130 is at least partially received by the first receiving element 150 and at least partially received by the second receiving element 120. It is seen in FIG. 1 that the radii of the first receiving element 150 and the second receiving element 120 is smaller than the radius of the alignment interconnect element 130. This means that, when the spherical alignment interconnect element 130 is brought in contact with the respective receiving elements 120, 150, a portion of spherical alignment interconnect element 130 is received by the holes that form the respective receiving element 120, 150. A small portion of the spherical alignment interconnect element 130 protrudes into the holes 120, 150 in the respective electrically conductive layers 116, 146—this means that the spherical shaped alignment interconnect element 130 cannot roll to another position on the first surface 141 and/or the second surface 111, and, consequently, the relative position of the first substrate 140 is fixed with respect to the relative position of the second substrate 110.

The switching semiconductor element 144 may be a transistor, a Field Effect Transistor (FET), a MOS Field Effect Transistor (MOSFET), thyristor, an insulated-gate bipolar transistor (IGBT) or other appropriate type of semiconductor switching element. It is to be noted that the first substrate 140 and/or the second substrate 110 may also include other electronic elements including other elements made of semiconductor material, such as silicon, silicon carbide, gallium arsenide, gallium nitride, diamond based semiconductor material or other appropriate semiconductor material(s). Examples of other electronic elements are diodes, resistors, capacitors, inductors, integrated circuits, or other appropriate electronic elements.

The substrates 110, 140 may be manufactured of multi layers of thermally conductive and electrically insulating materials (e.g., ceramics) and highly electrically conductive materials (e.g., metals) for routing. Examples of ceramics are Aluminum Nitride (AlN), Aluminum Oxide ($Al_2O_3$) or Silicon Nitride ($Si_3N_4$). Another example of a substrate is $Si_3N_4$ sandwiched between two thin metal layers, for example, thin layers of copper or Aluminum. Typically, in the relevant field, such substrates are termed as Direct Bonded Copper (DBC) substrates or Active Metal Bonding/Brazing (AMB) substrates. Suitable substrates are described in the paper "Comparison of Silicon Nitride DBC and AMB Substrates for different applications in power electronics" of Manfred Goetz et al, pp 57-65, PCIM Europe conference, Nuremberg, 14-16 May 2013, published by VDE Verlag, Berlin.

The electrically conductive layers 112, 116, 142, 146 and/or the interconnect elements 130, 132 may be made of metal such as copper, aluminum, of other metals or of other electrically conductive materials. Optionally, the material(s) of which the electrically conductive layers 112, 116, 142, 146 and/or the interconnect elements 130, 132 are made, is a good heat conductor such that the layers 112, 116, 142, 146 and the interconnect elements 130, 132 contribute to the distribution and conduction of heat towards places (not shown) where heat can be conducted away from the semiconductor power device 100 (for example, an interface to a heat sink).

One may read "electrode" instead of electrically conductive layer 112, 116, 142, 146. However, it is to be noticed that the electrically conductive layers 112, 116, 142, 146 are not by definition coupled to a specific voltage or signal. Thus, the electrically conductive layers 112, 116, 142, 146 may be isolated island provided on the first surface 111 or the second surface 141. They may also be electrically connected to other components of the semiconductor power device 100, such as the switching semiconductor element. This may be done by additional electrically conductive layers (not shown) provided on the first surface or the second surface, and/or by additional electrical connections (not shown) provided in the interior of the substrate, and/or by additional electrically conductive layers (now shown) provided at the surface of the first substrate 140 and the second substrate 110 that face away from the gap between the two substrates 110, 140, and/or electrically conductive through the substrates.

In the example of FIG. 1, the semiconductor power device 100 is provided with a single alignment interconnect element 130. However, two, three or more alignment interconnect elements may be provided, each together with a receiving element coupled to the first substrate and a receiving element coupled to the second substrate. In all or most of the following examples, where only one or two alignment interconnect elements (and corresponding receiving elements) are drawn and discussed, one with ordinary skill in the art may provide more than one or two of those alignment interconnect elements (together with corresponding receiving elements). In particular it is to be noticed that using three (or more) alignment interconnect elements result in a stable positioning of the second substrate 110 with respect to the first substrate 140.

The material of alignment interconnect element 130, and also of the interconnect element 132, may be an electrically conductive material such as copper or aluminum. In the example of FIG. 1 the alignment interconnect element 130 is partially received by a hole 120, 150 in the respective electrically conductive layers 116, 146. This means that the alignment interconnect element 130 touches an edge of the hole 120, 150 which is formed by the material of the respective electrically conductive layers 116, 146. Consequently, there is an electrical connection between the alignment interconnect element 130 and the respective electrically conductive layers 116, 146. To improve the electrical connection (and/or to fixate the position of the alignment interconnect element 130 better), the alignment interconnect element 130 may be fastened to the respective electrically conductive layers 116, 146 by means of solder (not shown) or any other appropriate fastening material (not shown) or fastening method. The use of such additional fastening material may also apply to the contact between the interconnect element 132 and its respective electrically conductive layers 112, 142. It is further noted that the interconnect element 132 is at least in contact with its respective electrically conductive layers 112, 142 such that there is also an electrical connection between them. It may also be that the material of the alignment interconnect element 130 and of the interconnect element 132 is thermally conductive such that heat can be transported away from, for example, the first substrate 140 to the second substrate 110. The heat may be generated in the switching semiconductor element 144. Copper is also a good thermal conductor. The amount of heat that can be transported via the alignment interconnect element 130 may be increased by soldering the alignment interconnect element 130 to the respective electrically conductive layers 116, 146. These optional choices for the materials for the elements of the interconnect structure do also apply to the alignment interconnect elements and the interconnect elements of the examples that are discussed hereinafter. As will be discussed hereinafter, the first substrate 140 and/or the second substrate 110 may be provided with a heat sink (not shown) which forms a heat transfer interface to the environment.

The shape of the interconnect element 132 and the alignment interconnect element 130 are spheres. Embodiments of the interconnect element 132 and the alignment interconnect element 130 are not limited to these shapes. Other possible shapes are: a rectangular box, a cube, a rectangular cuboid, a cylinder, a tube, an egg, a rugby-ball, a diamond shaped ball and a diamond.

The receiving elements 120, 150 are holes in the example of FIG. 1, but embodiments of the receiving elements 120, 150 are not limited to such shapes. Every shape that is capable of receiving a portion of an alignment interconnect element and thereby, fixating a relative position of the alignment interconnect element with respect to the receiving element is a suitable shape. For example, when the alignment interconnect element has a cylindrical shape, a portion of the cylindrical shape can be received by a hole or recess, but also by a hollow cylinder that extends from the surface of the substrate.

Although not shown explicitly in FIG. 1, the first substrate 140 and/or the second substrate 110 may include additional electrical components, such as additional active semiconductor elements (for example, a transistor or any other type of switching semiconductor elements), additional passive semiconductor elements (for example, a diode or a resistor based on semiconductor material), and/or other passive electrical components (for example, a resistor, a capacitor and/or an inductor).

Figure 2A:
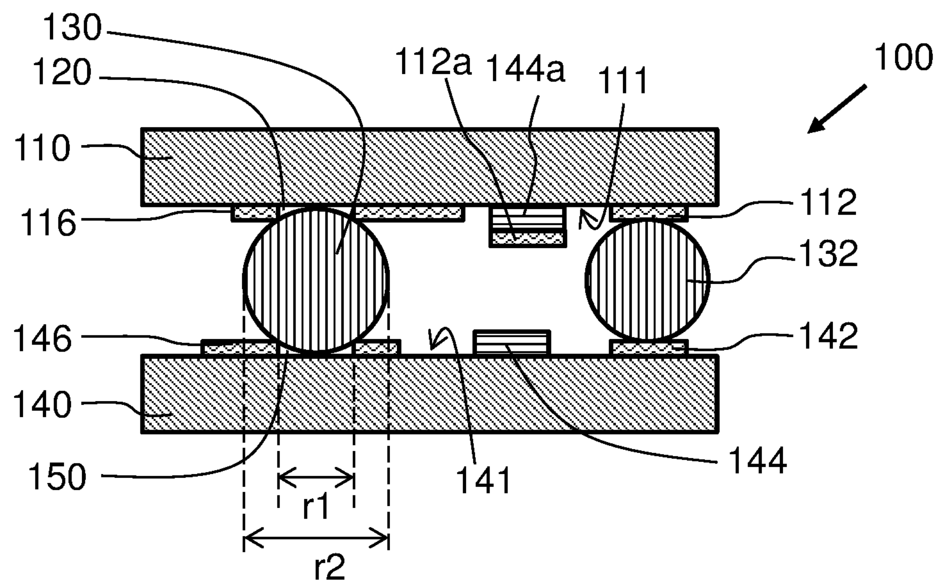

FIG. 2*a* schematically shows a cross-sectional view of the embodiment of the semiconductor power device 100 of FIG. 1 along a plane perpendicular to the first substrate 140 and through line II-II'. The semiconductor power device 100 comprises a first substrate 140, a second substrate 110 and an interconnect structure. The first substrate 140 has a first surface 141, comprises first electrically conductive layers 142, 146 provided on the first surface 141 and comprises a switching semiconductor element 144 provided on the first surface 141. The second substrate 110 comprises a second surface 111 that faces the first surface 141. The second substrate 110 comprises second electrically conductive layers 112, 116 provided on the second surface 111. The second substrate 110 comprises a semiconductor element 144*a*. The semiconductor element may also be a switching semiconductor element examples of which are discussed previously, but may also be passive semiconductor elements like diodes or even resistors made of a semiconductor material. One or more second electrically conductive layers 112*a* are arranged on or at a surface of the semiconductor element 112*a*. The first electrically conductive layer 146 and the second electrically conductive layer 116 both comprise a receiving element 120, 150 in the form of a hole in the respective electrically conductive layers 116, 146. The interconnect structure comprises an alignment interconnect element 130 which is a metal sphere that is partially received by the holes in the respective electrically conductive layers 116, 146 that form the receiving element 120, 150. The interconnect structure also comprises an interconnect element 132 interposed in between the first electrically conductive layer 142 and the second electrically conductive layer 112. The alignment interconnect element 130, as well as the interconnect element 132, provides an electrical connection between specific first electrically conductive layers 142, 146 and specific second electrically conductive layers 112, 116, respectively.

The receiving element 120, 150 are, for example, circular holes. In FIG. 2*a* the radius r1 of the circular receiving element 150 has been indicated. The radius of the receiving element 120 is about equal to the radius r1 of the receiving element 150. The alignment interconnect element 130 is a sphere and its radius r2 is indicated in FIG. 2*a*. The respective radius r1 of the circular receiving elements 120, 150 is smaller than the radius r2 of the spherical alignment interconnect element 130. It is to be noted that the radius of the receiving element 120 relates in a similar way to the radius r2 of the spherical alignment interconnect element

130. Typical examples are: the electrically conductive layers are about 300 μm thick, the radius r1 of the hole forming the receiving element 150 is 1 mm, and the radius r2 of the spherical alignment interconnect element is 1.6 mm. In an embodiment, depending on the depth of the hole that forms receiving element 150, the radius r1 of receiving element 150 is relatively small compared to the radius r2 of the spherical alignment interconnect element 130 such that the spherical alignment interconnect element 130 does not touch the bottom of the hole that forms the receiving element 150 and does touch the edge of the whole at the top of the electrically conductive layer.

Figure 2B:
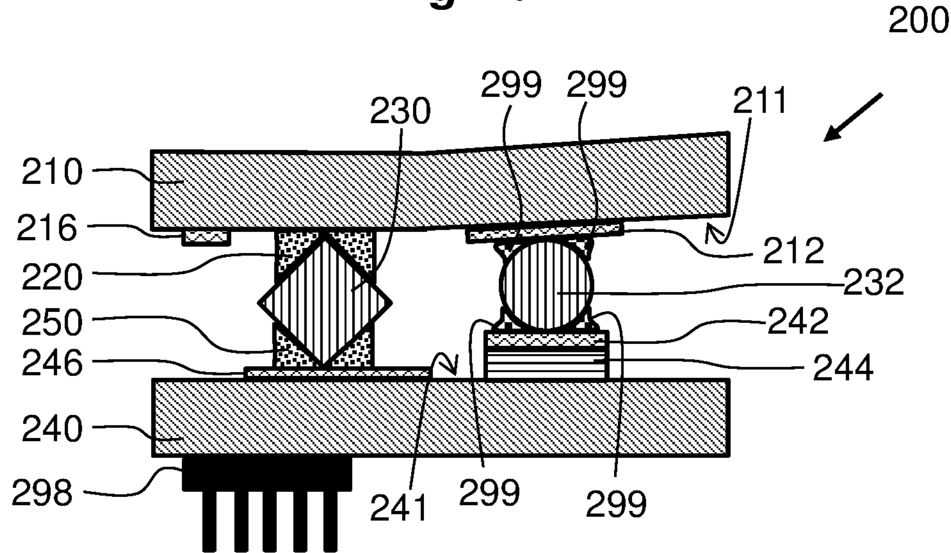

FIG. 2*b* schematically shows a cross-sectional view of another embodiment of a semiconductor power device 200. The semiconductor power device 200 includes a first substrate 240, a second substrate 210 and an interconnect structure.

The first substrate 240 includes a first surface 241, a switching semiconductor element 244 and first electrically conductive layers 246, 242. The switching semiconductor element 244 is provided on the first surface 241 and one specific first electrically conductive layer 246 is provided on the first surface 241. Another first electrically conductive layer 242 is provided on a surface of the switching semiconductor element 244 that is facing away from the first substrate 240. The first substrate 240 also includes a first receiving element 250 that protrudes away from the first electrically conductive layer 246 and has a recess that matches a shape of a diamond shaped element. The second substrate 210 has a second surface 211 that faces towards the first surface 241. The first substrate 240 is also coupled to (an optional) heat sink 298 that is thermally coupled to the first substrate 240 at a surface of the first substrate 210 that faces away from the first surface 241.

The second substrate 210 has a second electrically conductive layer 212 and optionally other second electrically conductive layer 216. The second substrate 210 also includes a second receiving element 220. The second receiving element 220 protrudes away from the second surface 211 and has a recess that matches a shape of a diamond shaped element.

The interconnect structure of the semiconductor power device of FIG. 2*b* includes a spherical shaped interconnect element 232 that is electrically and thermally coupled by means of attachment joints 299 to first electrically conductive layer 242 and to second electrically conductive layer 212. The attachment joints 299 may be formed by solder, glue, epoxy or may be ceramic material formed by a sintering process. The interconnect structure also includes a diamond shaped alignment interconnect element 230. One tip of the diamond shaped alignment interconnect element 230 has a shape that corresponds to the shape of the recess of the first receiving element 250 and an opposite tip of the diamond shaped alignment interconnect element 230 has a shape that corresponds to the shape of the recess of the second receiving element 220. The respective tips of the diamond shaped alignment interconnect element 230 are received by the recesses of the first receiving element 250 and the recess of the second receiving element 220. Thus, the receiving elements 220, 250 at least partially receive the diamond shaped alignment interconnect element 230. The partial reception of the diamond shaped alignment interconnect element 230 results in the alignment of the position of the first substrate 140 with respect to the second substrate 110.

In FIG. 2*b* it has already been shown that the shape and size of the alignment interconnect element 230 must or should be adapted to the shape and size of the receiving elements 220, 250. In particular the length of the alignment interconnect element 230 (measured along a line parallel to a shortest line from the first substrate 140 to the second substrate 110) and the amount that the receiving elements 250, 220 protrude away from the first surface 141 and away from the second surface 211, respectively, determine the positioning of the first substrate 240 with respect to the second substrate 210 in the z-dimension (and, thus, the distance between the substrates 210, 240). The size of the interconnect element 232 is adapted to the required distance (in the z-dimension) between the two substrates 210, 240 and is adapted to the depth of the electrically conductive layers 212, 242 and the switching semiconductor element 244. As shown in FIG. 2*b*, in an exaggerated form, the second substrate 210 might be subjected to warpage. The size of the interconnect element 232 is also adapted to the specific distance between the first substrate 240 and the second substrate 210 at the location where the interconnect element 232 is provided such that a good electrical connection is made. During the assembly of the semiconductor power device the amount of warpage is determined (for example, measured) to determine what the size of the interconnect element 232 has to be in order to obtain a good contact between the interconnect structure 232 and the respective electrically conductive layers 212, 242. It is also immediately clear from FIG. 2*b* that interconnect elements of different sizes are used, and have to be used when the distance between the substrates and/or the electrically conductive layers varies. The size of interconnect elements is determined on basis of the above discussed determination. In an optional embodiment there are at least two interconnect elements (both not being an alignment interconnect element) that have different sizes.

Figure 3A:
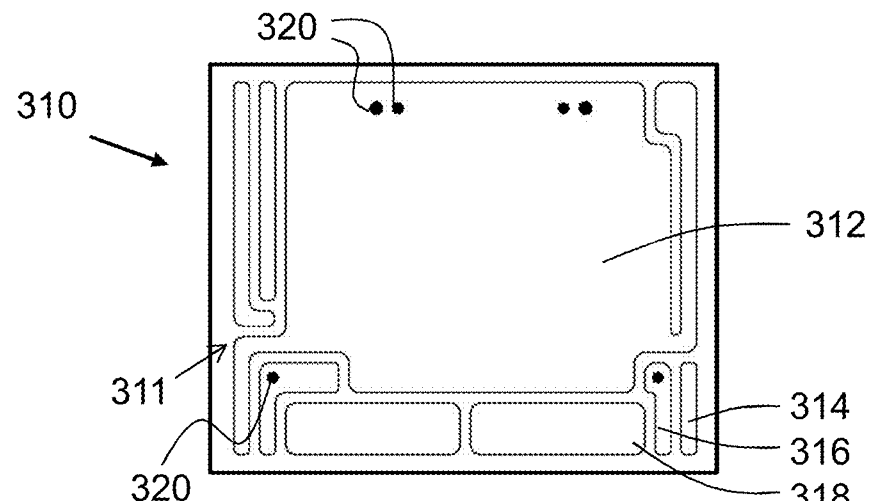

FIG. 3*a* schematically shows a view of an embodiment of a second substrate 310 for use in a semiconductor power device. In this view, a second surface 311 of the second substrate 310 is facing towards the viewer. On this second surface 311 a plurality of electrically conductive layers is provided of which some are indicated by numbers 312 . . . 318. In the electrically conductive layers are provided a number of circular shaped holes (drawn by means of circles filled with black) of which some are indicated by numbers 320. The circular shaped holes are receiving elements for at least partially receiving alignment interconnect elements.

Figure 3B:
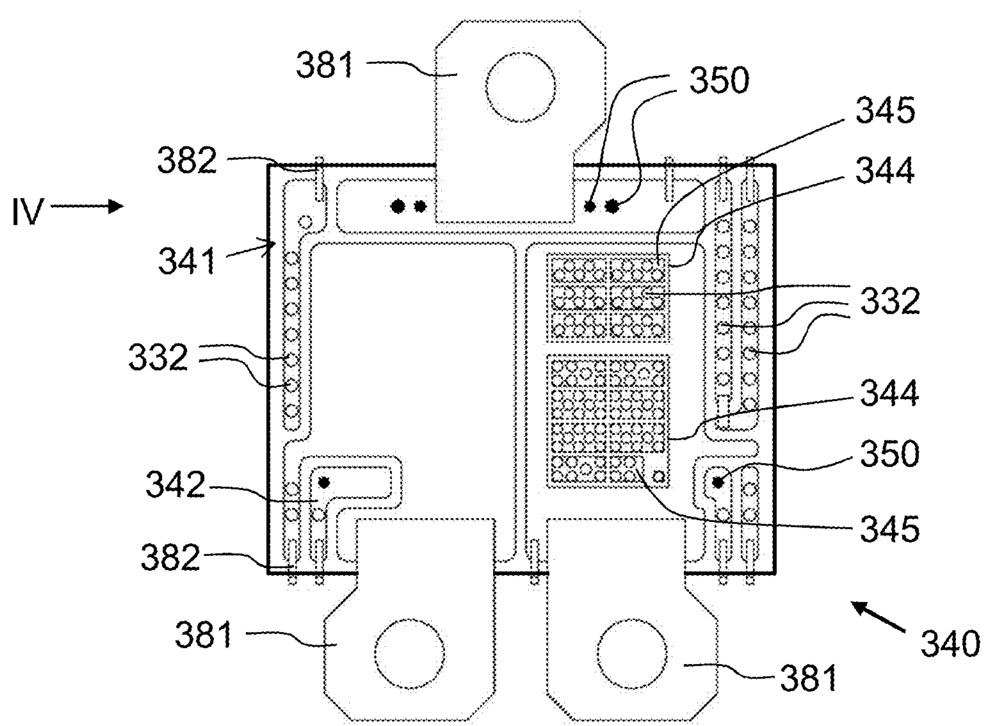

FIG. 3*b* schematically shows a view of an embodiment of a first substrate 340 for use in the same semiconductor power device as of the second substrate 310 of FIG. 3*a*. In this view, a first surface 341 of the first substrate 340 is facing towards the viewer. When a semiconductor power device is assembled, the first surface 341 has to face the second surface 311 of the second substrate 310. On the first surface 341 are provided multiple electrically conductive layers of which one is indicated with number 342. When the first substrate 340 is assembled opposite to the second substrate 310, electrically conductive layer 342 faces electrically conductive layer 316 of the second substrate 310. Some of the electrically conductive layers are electrically coupled to external electrodes 381 or external pins 382. When the semiconductor power device is assembled, the external electrode 381 and the external pins 382 are for receiving the power signals that must or should be controlled by the semiconductor power device and for receiving and/or providing control signals.

Optionally, at the first surface, directly on one of the electrically conductive layers, switching semiconductor elements 344 are provided. These switching semiconductor elements 344 include surface electrodes of an electrically conductive material. One of the surface electrodes is indicated with the value 345. The surface electrodes are provided on surfaces of the switching semiconductor elements 344 that face away from the first surface 341.

In FIG. 3*b* 6 circles filled with black are drawn, of which some are indicated with reference number 350. The 6 circles represent circular holes in the electrically conductive layers and they are receiving elements for at least partially receiving alignment interconnect elements. When FIG. 3*b* and FIG. 3*a* are carefully inspected, it can be noticed that the position of the receiving elements of the first substrate 340 is such that they are opposite to the receiving elements of the second substrate 310 when the first substrate 340 and the second substrate 310 are assembled into a semiconductor power device. Although not shown, alignment interconnect elements may be (at least partially) received by the receiving elements of the first substrate 340 or the receiving element of the second substrate 310. In an embodiment, appropriate alignment interconnect elements are copper balls that have a radius that is larger than the radius of the receiving elements. For example, copper balls are placed on the receiving elements of the first substrate 340 and, optionally, they are attached (for example, soldered or sintered) to the electrically conductive layers in which respective receiving elements are provided. If, subsequently, the second substrate 310 is placed on top of these copper balls at about a position where a portion of the copper balls is received by the receiving elements of the second substrate 310, the receiving element of the second substrate 340 shall receive a portion of the copper balls and, consequently, the position of the second substrate 310 is fixed (in other words: aligned) to the position of the first substrate 340. The copper balls may also be attached (for example, soldered or sintered) to the electrically conductive layers of the second substrate 310 in which the respective receiving elements are provided.

In the view of FIG. 3*b* multiple interconnect element are drawn by means of a small circle. A few interconnect elements are indicated with reference number 332. Also, on top of the switching semiconductor elements 344, interconnect elements are provided. In the embodiment of FIG. 3*b*, the interconnect elements are spherical copper elements which may be attached (for example, soldered or sintered) to their respective electrically conductive layer or their respective surface electrodes. When the second substrate 310 is placed on top of the first substrate (and the alignment interconnect elements are partially received by the receiving elements of both substrates), the interconnect elements touch specific electrically conductive layers provided at the second surface 311 of the second substrate 310 and provide electrical and heat conductive connections between the first substrate 340 and the second substrate 310. Optionally, the interconnect elements are attached (for example, soldered or sintered) to the electrically conductive layers of the second substrate 310 with which they are in contact.

Figure 4:
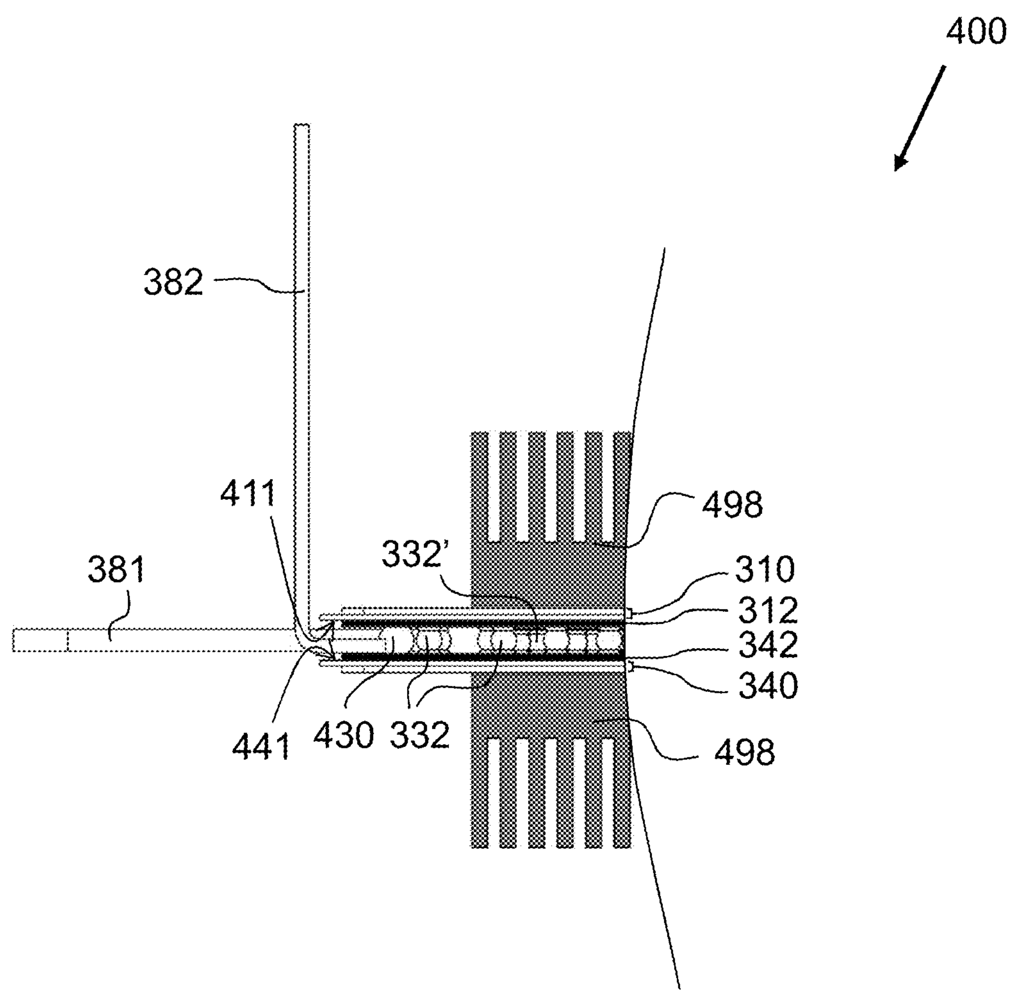

FIG. 4 schematically shows a side-view of an embodiment of a semiconductor power device 400. In FIG. 3*b* an arrow indicated with IV indicates the direction of the viewer and from which side the side-view has been obtained. The semiconductor power device 400 is an assembled semiconductor power device 400 that includes the first substrate 340 and the second substrate 310 of FIGS. 3*b* and 3*a*, respectively.

The semiconductor power device 400 of FIG. 4 includes the substrate 340, the second substrate 310, the interconnect structure includes an alignment interconnect element 430 and interconnect elements 332, 332', and two cooling fins

498. As discussed in the context of FIG. 3*b*, the second substrate includes external pins/contacts 381, 382. In the semiconductor power device 400 the first surface 341 of the first substrate 340 faces towards the second surface 311 of the second substrate 310.

On the first surface 341 are provided first electrically conductive layers 342 which are drawn, in the side-view of FIG. 4, as a black line on the first surface 341. On the second surface 311 are provided second electrically conductive layers 312 which are drawn, in the side-view of FIG. 4, as a black line of the second surface 311.

The cooling fins 498 are provided on a surface of the first substrate 340 and of the second substrate 310 that faces away from the first surface 341 and the second surface 311, respectively. The cooling fins 498 receive heat from the respective substrates, 310, 340 and provide this heat to an environment of the semiconductor power device 400. In specific assemblies, a plurality of semiconductor power devices 400 may be integrated in a larger assembly which includes, for example, means to provide active cooling to the cooling fins 498.

The interconnect structure provides a plurality of electrical connections between the first electrically conductive layers 342 and the second electrically conductive layers 312. It is seen that a plurality of interconnect elements 332, 332' are attached (for example, soldered) to the respective electrically conductive layers 342, 312. It can also be seen that the radius of interconnect element 332' is smaller than the radius of interconnect element 332. This may be because interconnect element 332' is in between an electrode provided on a semiconductor element, or may be because, at the location of interconnect element 332', a distance between the respective electrically conductive layers is smaller than at other locations.

The interconnect structure also includes alignment interconnect elements of which one specific alignment interconnect element 430 can be seen in FIG. 4. The alignment interconnect element 430 is partially received by a hole in one of the first electrically conductive layers 342 and partially received by a hole in one of the second electrically conductive layers 312. The radius of the alignment interconnect element 430 is larger than the radii of the holes which receive the alignment interconnect element 430. Furthermore, because the alignment interconnect element 430 partially protrudes in the respective electrically conductive layers, the radius of the alignment interconnect element 430 is larger than the radius of the other interconnect elements 332, 332'.

Figure 5:
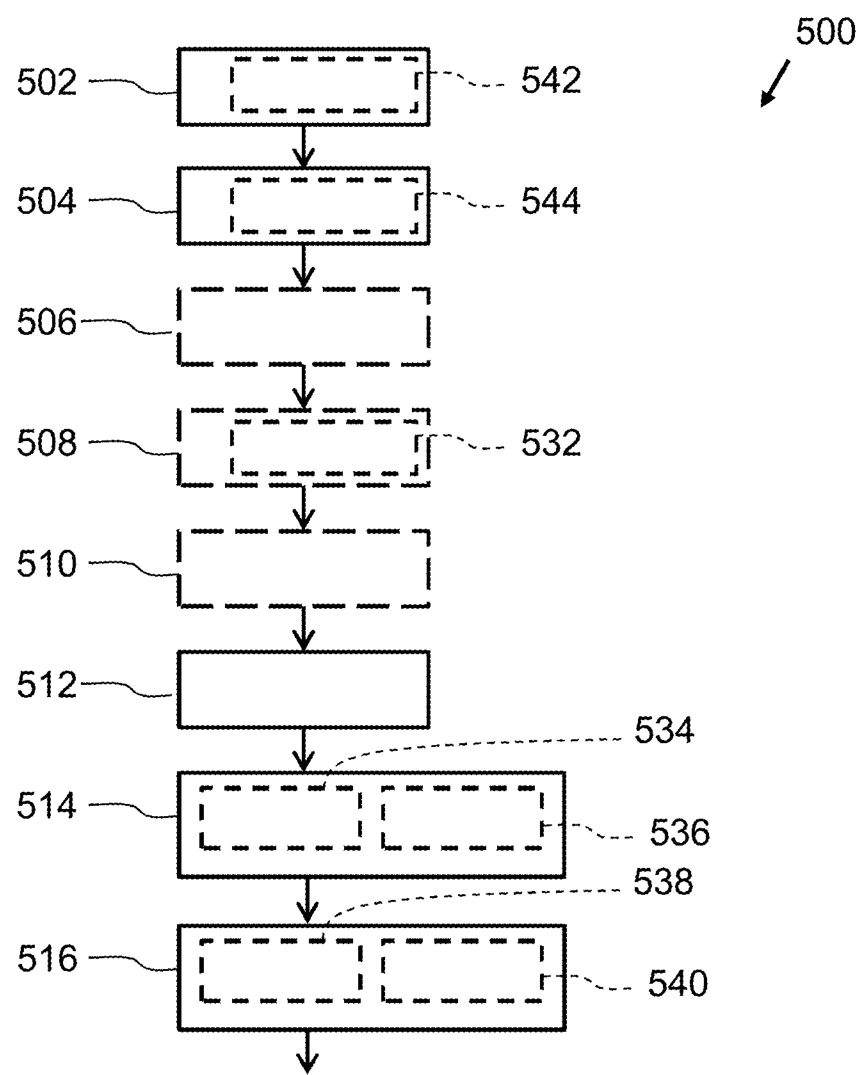

FIG. 5 schematically shows a method 500 of assembling a power semiconductor device. The method 500 of assembling a power semiconductor device includes:

obtaining 502 a first substrate including a switching semiconductor element, the first substrate having a first surface and locally including first electrically conductive layers and a first receiving element, the switching semiconductor element being provided on the first surface, obtaining 504 a second substrate including a second surface facing the first surface, the second substrate including a second receiving element and locally including second electrically conductive layers, obtaining 512 an alignment interconnect element, providing 514 the alignment interconnect element to one of the first receiving element and the second receiving element to affect a partial reception of the alignment interconnect element by the receiving element, and providing 516 the alignment interconnect element to another one of the first receiving element and the second receiving element to affect a partial reception of the alignment interconnect element by the receiving element.

Optionally, the method 500 also includes the stages:

obtaining 506 data describing a required positioning of the first substrate with respect to the second substrate, measuring 508 characteristics of the first receiving element and of the second receiving element, determining 510 characteristics of an alignment interconnect element based on the obtained data and the measured characteristics, and the stage of obtaining 512 an alignment interconnect element is based on the results of the stage of determining 510 the characteristics of the alignment interconnect element (in other words: the obtained alignment interconnect element substantially has the determined characteristics).

The data that is obtained 506 to describe a required positioning of the first substrate with respect to the second substrate and may include a required distance between the first substrate and the second substrate, but may include more information like, at a specific location the distance between the substrates must or should be a specific value and at another specific location the distance between the substrates must or should be another specific value.

In the stage of measuring 508 characteristics of the first receiving element and of the second receiving element, it is, for example, determined what the shape is of the respective receiving elements. Other characteristics may be the distance that the receiving elements protrude out of the surfaces of the substrates when the receiving elements are some sort of protrusions. Measuring characteristics may also include the determination of the exact location of the receiving elements.

In the stage of determining 510 the characteristics of the alignment interconnect element it is ensured that, when the obtained alignment interconnect element has the determined characteristics and is at least partially received by the first receiving elements and partially received by the second receiving element, the first substrate is positioned with respect to the second substrate as described in the required data in other words, the first substrate is well aligned with respect to the second substrate. For example, in this stage the shape of the alignment interconnect element is selected and/or a length of the alignment interconnect element. For example, when the available alignment interconnect elements are spheres and the receiving elements are holes, in this stage a specific radius is selected for spherical shaped alignment interconnect element. In a specific embodiment, when for example, the receiving elements are not exactly opposite to each other when the first substrate is positioned with respect to the second substrate as described in the obtained data, it may be that in the stage of determining the characteristics of the alignment interconnect elements, a specific shape is selected which still results in a good alignment although the receiving elements are not exactly opposite to each other.

The stages of providing 514, 516 the alignment interconnect element to one of the receiving element means that the alignment interconnect element is brought in contact with the receiving element such that it is partially received by the receiving element. This may be done by placing the alignment interconnect element on the receiving element, or placing the receiving element on the alignment interconnect element and using the gravity to move the alignment interconnect element, or the receiving element, to such a position that the alignment interconnect element is partially received by the receiving element. In specific embodiments, it may include providing a force to ensure that the alignment interconnect element is partially received by the receiving element.

In an embodiment, the stage of providing 514 the alignment interconnect element to one of the first receiving element and the second receiving element includes soldering 534 the alignment interconnect element to the receiving elements, or includes sintering 536 the alignment interconnect element to the receiving elements. In general, in this stage, the alignment interconnect element is attached to the receiving elements.

In an embodiment, the stage of providing 516 the alignment interconnect element to one of the first receiving element and the second receiving element includes soldering 538 the alignment interconnect element to the receiving elements, or includes sintering 540 the alignment interconnect element to the receiving elements. In general, in this stage, the alignment interconnect element is attached to the receiving elements.

In an embodiment, when the receiving elements are holes or recesses, the stage of measuring 508 the characteristics of the first receiving element and of the second receiving element includes at least one of determining 538 a radius of the receiving element and determining 540 a depth of the receiving element, the radius of the first receiving element is measured in a plane substantially parallel to the first surface, the radius of the second receiving element is measured in a plane substantially parallel to the second surface, the depth of the first receiving element is measured in a plane substantially perpendicular to the first surface, the depth of the second receiving element is measured in a plane substantially perpendicular to the second surface.

In an embodiment, the stage of obtaining 502 a first substrate includes manufacturing or assembling 542 the first substrate. The manufacturing or assembling 542 may include providing the first electrically conductive layers and the switching semiconductor element on the first surface and providing a first receiving element on the first substrate.

In an embodiment, the stage of obtaining 504 the second substrate includes manufacturing or assembling 544 the second substrate. The manufacturing or assembling 544 may include providing the second electrically conductive layers on the second surface and providing the second receiving element on the second substrate.

In FIG. 5 the stages of the method are presented in a specific order. The method is not limited to the shown order of the stages of the method. In so far specific stages do not directly depend on each other, they may be performed in another order and/or they may be performed in parallel.

It should be noted that the above-mentioned embodiments illustrate rather than limit some embodiments, and that those skilled in the art will be able to design many alternative embodiments without departing from the scope of the appended claims.

In the claims, any reference signs placed between parentheses shall not be construed as limiting the claim. Use of the verb "include" and its conjugations does not exclude the presence of elements or steps other than those stated in a claim. The article "a" or "an" preceding an element does not exclude the presence of a plurality of such elements. Some embodiments may be implemented by means of hardware including several distinct elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A method of assembling a power semiconductor device, the method comprising:

obtaining a first substrate including a switching semiconductor element, the first substrate having a first surface and locally including first electrically conductive layers and a first receiving element, the switching semiconductor element being provided on the first surface;

obtaining a second substrate including a second surface facing the first surface, the second substrate including a second receiving element and locally including second electrically conductive layers;

obtaining an alignment interconnect element;

providing the alignment interconnect element to one of the first receiving element and the second receiving element to effect a partial reception of the alignment interconnect element by the receiving element; and providing the alignment interconnect element to another one of the first receiving element and the second receiving element to effect a partial reception of the alignment interconnect element by the receiving element;

wherein the method further comprises:

obtaining data describing a required positioning of the first substrate with respect to the second substrate, measuring characteristics of the first receiving element and of the second receiving element; and determining characteristics of the alignment interconnect element based on of the obtained data and the measured characteristics, wherein obtaining the alignment interconnect element comprises obtaining the alignment interconnect element on basis of the determined characteristics, and wherein the receiving elements are holes or recesses and measuring the characteristics of the first receiving element and of the second receiving element comprises at least one of determining a radius of the receiving element and determining a depth of the receiving element.

2. The method of assembling a power semiconductor device according to claim 1, wherein at least one of the stages of providing the alignment interconnect element to the receiving elements includes one of soldering the alignment interconnect element to the receiving elements and sintering the alignment interconnect element to the receiving elements.

3. The method of assembling a power semiconductor device according to claim 1, wherein the radius of the first receiving element is measured in a plane substantially parallel to the first surface, the radius of the second receiving element is measured in a plane substantially parallel to the second surface, the depth of the first receiving element is measured in a plane substantially perpendicular to the first surface, the depth of the second receiving element is measured in a plane substantially perpendicular to the second surface.

4. The method of assembling a power semiconductor device according to claim 1, wherein determining the characteristics of the alignment interconnect element comprises selecting at least one of: a shape, a length and a depth, of the alignment interconnect element.

5. The method of assembling a power semiconductor device according to claim 1, wherein determining the characteristics of the alignment interconnect element comprises selecting the alignment interconnect element to have a spherical shape having a specific radius.

6. The method of assembling a power semiconductor device according to claim 5, wherein the radius is selected to be larger than the radii of the holes or recesses.

7. The method of assembling a power semiconductor device according to claim 6, wherein the radius is selected to be between 1.3 and 2.5 times larger than the radii of the holes or recesses.

8. The method of assembling a power semiconductor device according to claim 1, wherein the holes or recesses do not extend into the first and second substrate.

* * * * *